(12) United States Patent
Clevenger et al.

(10) Patent No.: US 6,356,134 B1
(45) Date of Patent: Mar. 12, 2002

(54) UNIVERSAL CLOCK GENERATOR CIRCUIT AND ADJUSTMENT METHOD FOR PROVIDING A PLURALITY OF CLOCK FREQUENCIES

(75) Inventors: Lawrence A. Clevenger, LaGrangeville; Louis L. C. Hsu, Fishkill, both of NY (US); Li-Kong Wang, Montvale, NJ (US); Kevin P. Guay, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/531,734

(22) Filed: Mar. 21, 2000

(51) Int. Cl.[7] .............................................. G06F 1/04
(52) U.S. Cl. ........................ 327/291; 327/277; 327/283
(58) Field of Search .......................... 327/116, 119–122, 327/161, 270, 271, 276, 277, 283, 290, 291, 295; 331/1 A, 57

(56) References Cited

U.S. PATENT DOCUMENTS

| | | | |
|---|---|---|---|
| 3,824,484 A | * 7/1974 | Gillette | 331/48 |
| 3,916,341 A | * 10/1975 | Cool | 331/110 |
| 4,423,383 A | 12/1983 | Svendsen | |
| 4,977,581 A | 12/1990 | Cerminara | |
| 5,052,031 A | 9/1991 | Molloy | |
| 5,142,247 A | 8/1992 | Lada, Jr. et al. | |
| 5,371,417 A | 12/1994 | Mirov et al. | |
| 5,410,510 A | * 4/1995 | Smith et al. | 327/113 |
| 5,428,311 A | * 6/1995 | McClure | 327/276 |
| 5,461,332 A | 10/1995 | Mirov et al. | |
| 5,491,442 A | 2/1996 | Mirov et al. | |
| 5,783,961 A | * 7/1998 | Zhou et al. | 327/85 |
| 5,828,258 A | * 10/1998 | Ooishi et al. | 327/291 |

* cited by examiner

*Primary Examiner*—Kenneth B. Wells
(74) *Attorney, Agent, or Firm*—F. Chau & Associates, LLP

(57) ABSTRACT

A universal clock generator circuit, in accordance with the present invention, includes an oscillator unit including circuitry for providing a first clock frequency. A plurality of load blocks are included. The load blocks are selectively connectable to the oscillator such that a range of clock rates are derived from the first clock frequency by selectively connecting a number of the load blocks to the oscillator unit to provide one of a plurality of clock frequencies from a same output.

35 Claims, 15 Drawing Sheets

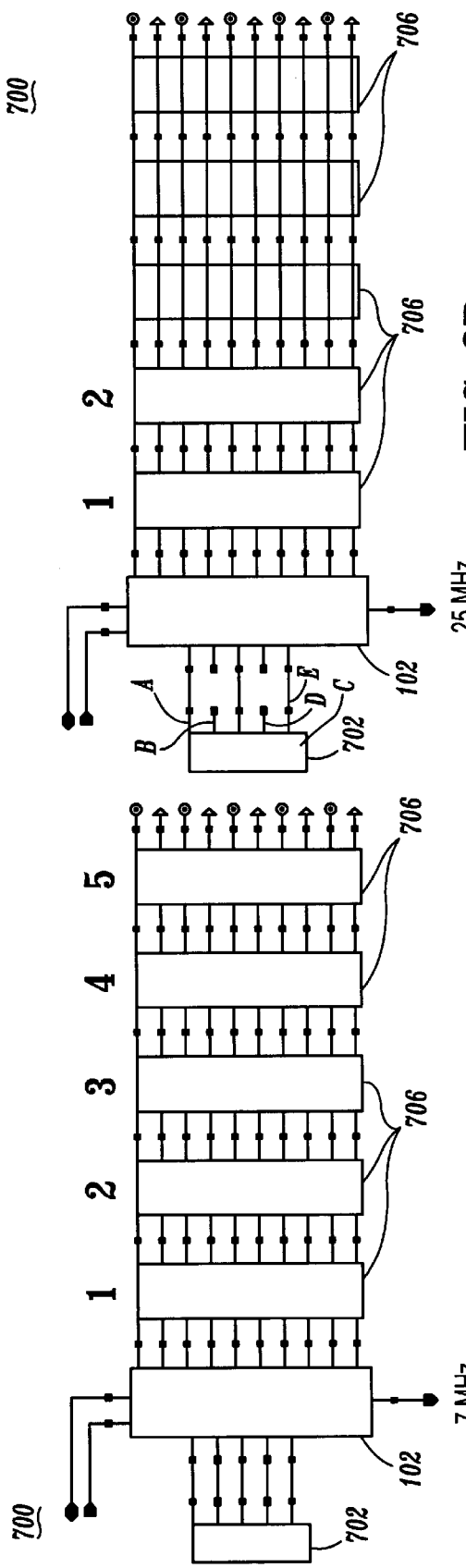
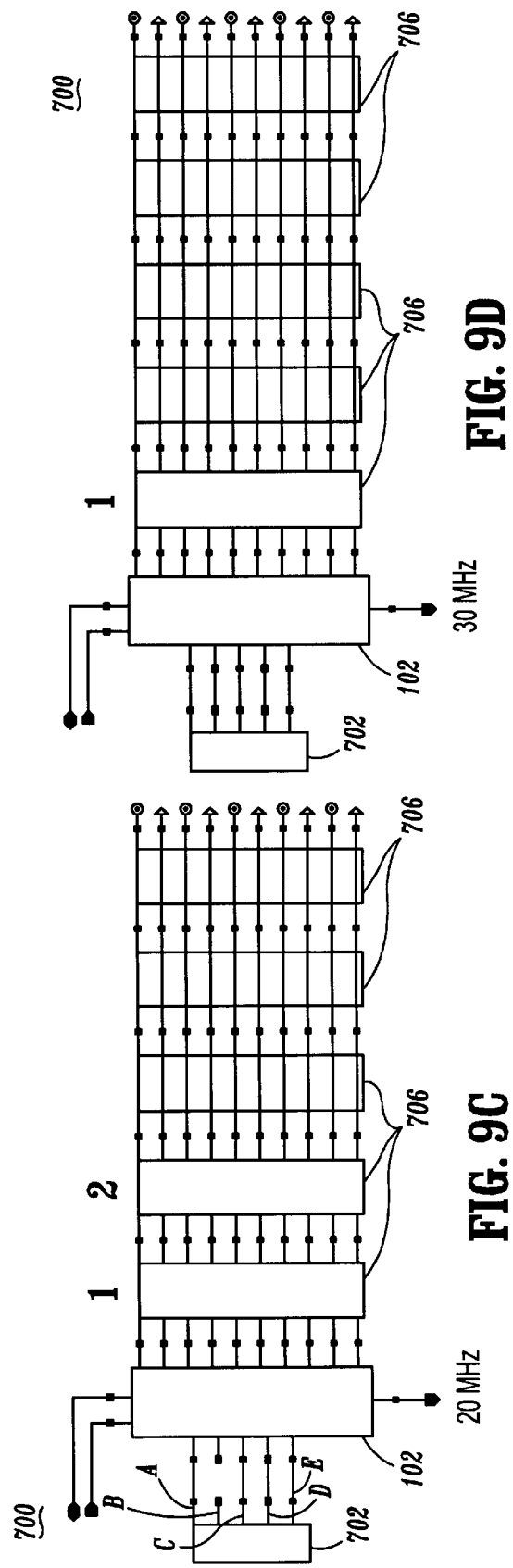
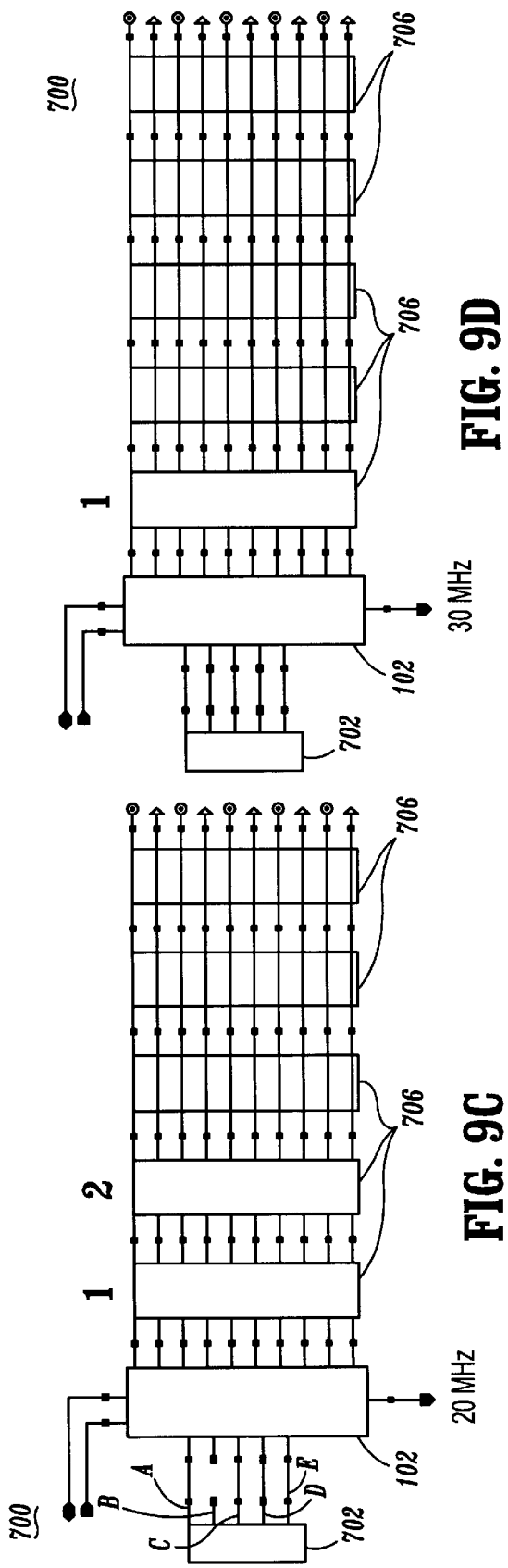

|  | # of Resistive Blocks | | | | | | |
|---|---|---|---|---|---|---|---|
|  | 1 | 2 | 3 | 4 | 5 | 6 | 7 |
| 0 | 118 | 64 | 43.86 | 33.4 | 27.27 | 23 | 19.9 |
| 1 | 83.6 | 45 | 31.25 | 23.6 | 19.46 | 16.3 | 14.18 |
| 2 | 61.54 | 33 | 22.85 | 16.65 | 14.18 | 12 | 10.33 |
| 3 | 47.1 | 25.3 | 17.43 | 12.7 | 10.81 | 9 | 7.87 |
| 4 | 36.98 | 20 | 14.88 | 10.36 | 8.47 | 7 | 6.17 |
| 5 | 30.6 | 16.4 | 11.29 | 8.65 | 7 | 6 | 5.1 | of Capacitor Elements (rows 0-5)

FIG. 11

UNIVERSAL CLOCK GENERATOR CIRCUIT AND ADJUSTMENT METHOD FOR PROVIDING A PLURALITY OF CLOCK FREQUENCIES

BACKGROUND OF THE INVENTION

1. Field of the Invention

The present invention relates clock generators, and more particularly to a universal clock generator which is employed to selectively generate different clock rates for a plurality of different applications.

2. Description of the Related Art

Current circuit design typically employs a library of different circuit components. This library, which may be called a design library, is employed to select different prefabricated components needed to construct a circuit. A design library having many circuit components is often more difficult to search and incurs addition maintenance costs. It is therefore advantageous to reduce the number of the circuit components in the design library. Reducing the number of components also saves layout time and saves the library maintenance cost. In general, to simplify a circuit by reducing the number of circuit components is one goal of the designer. For example, in a 1 Gbit dynamic random access memory (DRAM) design, many ring oscillators are used to generate clocks with different oscillating frequencies. This provides for the implementation of different DC generators. For example, for a Vpp (or the boosted word-line voltage, e.g., 3.1V) active generator, a 30 MHz of clock is needed, for a Vbb (or the substrate bias voltage, e.g., −0.5 V) active generator, a clock of 7 MHz is needed. For a generator to be used for a data path control, a clock of 5 MHz is needed, etc. Therefore, several oscillators are required in the Gb DRAM design to be used to generate different voltage levels. More clocks are also needed for other applications, for example, creating system timing, regulating refresh rate, etc.

It is time consuming to create each clock generator and individually trim each clock generator to provide a desirable oscillation rate for a specific application. Prior art devices include multiple clock frequency systems which are typically very complex and bulky. For example, in U.S. Pat. No. 4,977,581, a multiple clock system for multiple processor configurations is disclosed. A master clock system is used to synchronize sub-clock systems so that the multiple mainframe computers are capable of communicating with each other in real-time. This is the extension of the classic Phase Lock Loop (PLL) design. The PLL design has many variations, for example, U.S. Pat. No. 5,142,247. More detailed design theory and information on PLL's can be found in the book entitled, *Phase-Locked Loops Design, Simulation and Applications,* by Roland E. Best, third edition, 1997.

Through digital or analog methods, a PLL circuit is able to generate a clock frequency that is an integer or fraction multiple of a reference frequency. The generated frequency has its phase synchronized with the reference frequency by using a charge pump and a voltage control oscillator (VCO). Although PLL designs tend to be very bulky, the PLL design is needed in conventional chip design for clock synchronization so that high-speed digital operation can be carried out in a parallel or pipe-lined manner. The PLL design is also localized. Clock signals generated from PLL are not easily sent to places on a chip where the signals may be needed.

Therefore, a need exists for a universal clock generator which can tailor the clock rate for different applications or usage. A further need exists for the universal clock generator to have a modular design to provide frequencies in a wide range using the same design, such that the layout, library maintenance, verification, simulation, etc. of the design are simplified. A still further need exists for a universal clock which can be customized at any location on a chip to service a specific application.

SUMMARY OF THE INVENTION

A universal clock generator circuit, in accordance with the present invention, includes an oscillator unit including circuitry for providing a first clock frequency. A plurality of load blocks are also included. The load blocks are selectively connectable to the oscillator such that a range of clock rates are derived from the first clock frequency by selectively connecting a number of the load blocks to the oscillator unit to provide one of a plurality of clock frequencies from a same output.

Another universal clock generator circuit, in accordance with the present invention, includes an oscillator unit including circuitry for providing a first clock frequency and a plurality of resistor blocks including resistive elements. The resistor blocks are selectively connectable to the oscillator. A capacitor block has at least one capacitor element which is selectively connectable to the oscillator unit. The plurality of resistor blocks and the capacitor block include selective connections which are enabled and disabled to adjust the first clock frequency by selectively connecting a number of the resistor blocks and capacitor elements to the oscillator unit to provide one of a plurality of clock frequencies from a same output.

In alternate embodiments, the oscillator may include a ring oscillator. The load blocks may include resistor blocks for adjustment of the one of a plurality of clock frequencies. The load blocks may include a plurality of groups of resistor blocks, and the groups of resistor blocks provide a plurality of levels of adjustment of the one of a plurality of clock frequencies. The load blocks may include resistor blocks, and the resistor blocks may include first blocks and second blocks. The first blocks are connected in series and have a first end connected to a voltage source and a second end connected to the oscillator unit. The second blocks are connected in series and have a first end connected to a ground and a second end connected to the oscillator unit. The first blocks and the second blocks are preferably symmetrical relative to each other.

The load blocks include connections therebetween. The connections may include fuse structures for enabling and disabling the load blocks to selectively connect the load blocks to the oscillator unit. The connections may include transistors for enabling and disabling the load blocks to selectively connect the load blocks to the oscillator unit. The load blocks may include a capacitor block having at least one capacitor element which is selectively connectable to the oscillator unit to further adjust the one of a plurality of clock frequencies. The load blocks may include a plurality of groups of capacitance elements, the groups of capacitance elements providing a plurality of levels of of the one of a plurality of clock frequencies. The plurality of load blocks may include programmable connections.

A universal clock generator circuit layout, in accordance with the present invention includes an oscillator circuit for providing a first clock frequency, and a plurality of resistor blocks including resistive elements. The resistor blocks including a first group of resistor blocks and a second group of resistor blocks. The first group of resistor blocks are connected in series and have a first end connected to a source and a second end connected to the oscillator circuit. The second group of resistor blocks are connected in series and have a first end connected to a ground and a second end connected to the oscillator circuit. A capacitor block has at least one capacitor element connected to the oscillator circuit. The plurality of resistor blocks and the capacitor block include selective connections which are enabled and disabled to adjust the first clock frequency by selectively connecting a number of the resistor blocks and capacitor elements to the oscillator unit to provide one of a plurality of clock frequencies from a same output.

In alternate embodiments, the resistor blocks may include a plurality of different resistance values for levels of adjustment of the one of a plurality of clock frequencies. The first blocks and the second blocks are preferably symmetrical relative to each other. The selective connections may include fuse structures for enabling and disabling the resistor blocks and the capacitive elements to selectively connect the resistor blocks and the capacitive elements to the oscillator circuit. The selective connections may include transistors for enabling and disabling the resistor blocks and the capacitive elements to selectively connect the resistor blocks and the capacitive elements to the oscillator circuit. The plurality of resistor blocks may include programmable connections. The layout is employed at a plurality of locations on a chip to provide different clock frequencies. The layout is the only type of clock circuit employed on a chip to provide different clock frequencies at a plurality of locations on the chip.

A method for providing clock signals on a chip, in accordance with the present invention, includes the step of providing a universal clock generator circuit comprising an oscillator unit including circuitry for providing a first clock frequency, and a plurality of load blocks, the load blocks being selectively connectable to the oscillator such that a range of clock rates are derived from the first clock frequency by selectively connecting a number of the load blocks to the oscillator unit to provide one of a plurality of clock frequencies from a same output. The method further includes the steps of placing the universal clock generator circuit at a plurality of locations on a semiconductor chip and trimming the load blocks to provide a clock frequency from each universal clock generator circuit on the semiconductor chip.

In other methods, the step of trimming the load blocks may include the step of providing connections and disconnections between the load blocks while forming the load blocks. The step of trimming the load blocks may include the step of providing connections and disconnections between the load blocks by respectively employing anti-fuses and fuses between the load blocks. The step of trimming the load blocks may include the step of providing connections and disconnections between the load blocks by employing transistors between the load blocks to enable and disable connections. The step of trimming the load blocks may include the step of eliminating load blocks from a layout to reduce layout area. The step of trimming the load blocks may also include the step of providing connections and disconnections between the load blocks by programming transistors between the load blocks to enable and disable connections. The step of programming transistors may include programming the transistors by employing a memory storage device. The transistors may be programmed after the semiconductor chip has been fabricated or packaged.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein:

FIGS. 9A–D show different configurations of the universal clock generator of FIG. 7 to provide different clock rates in accordance with the present invention;

FIG. 11 is an illustrative table which may be employed to select a clock rate in accordance with the present invention.

DETAILED DESCRIPTION OF PREFERRED EMBODIMENTS

Figure 1:
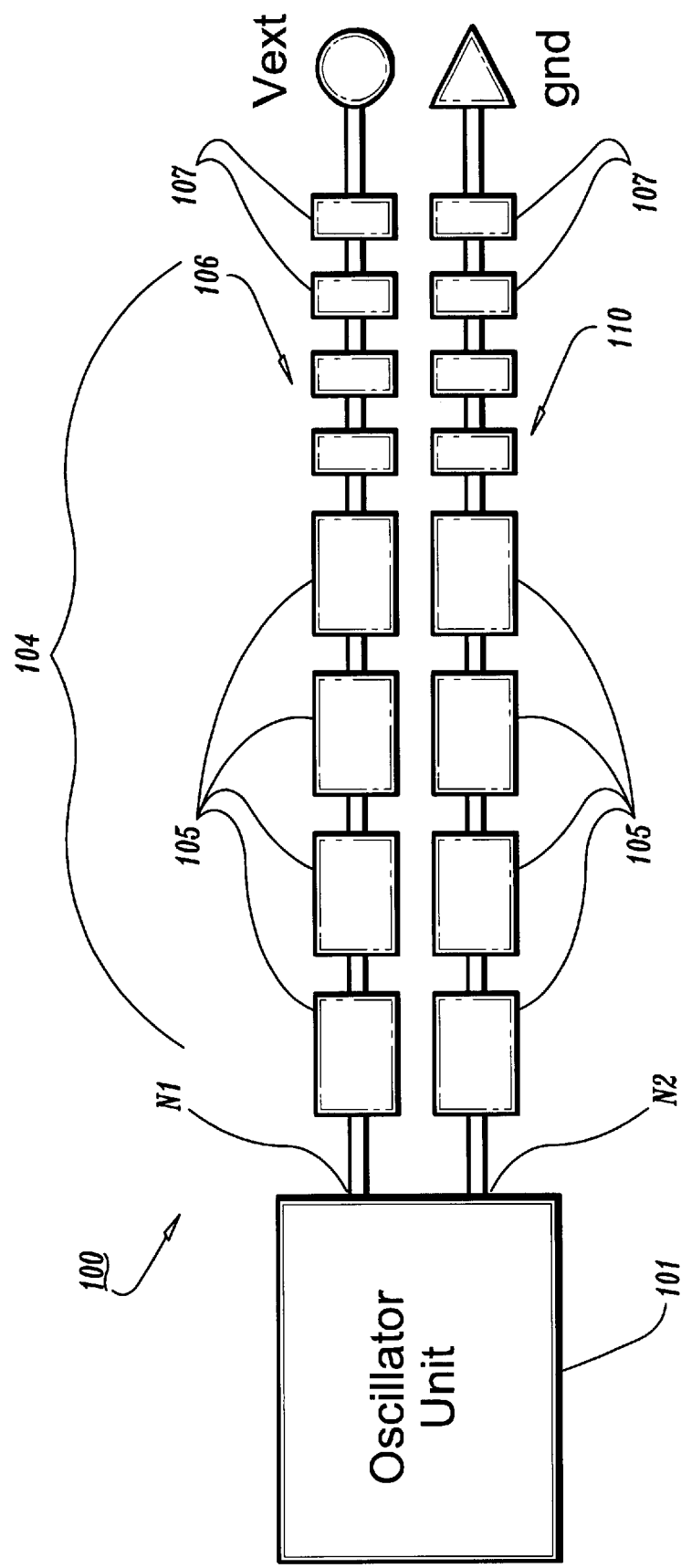
FIG. 1 is a schematic diagram of a universal clock generator having coarse and fine adjustment resistor blocks in accordance with the present invention.

The present invention relates to a universal clock generator for distributing a plurality of different clock rate signals. This universal clock generator preferably includes programmable capabilities so that clock signals may be generated at different clock rates for different applications. For example, a clock frequency may be altered to provide one or more different clock rates when the chip is fabricated, packaged in a module, or installed on a system. The universal clock generator may be used on a chip that needs to be interfaced with different input/output devices from different manufacturers. For example, a memory controller, which is made with such a programmable universal clock generator, can be used to interface memory chips with different clock rates. Another example may include an onchip charge pump design. During a test mode, the charge pump may have too much or not enough pump capacity. The pump speed may be adjusted by adjusting the clock rate of the pump's ring oscillator, in accordance with the universal clock of the present invention.

In one example, a clock rate may be programmed in accordance with the present invention based on input codes. For example, I/O codes are employed to program on-chip clock circuits. To be more specific, for example, a 3-bit code can decode 8 speeds by connecting or disconnecting a particular number of components to/from the universal clock generator. These components may include resistor components, capacitor components or a combination or both. In another example, a manufacturer of the universal clock generator can provide a table indicating how to program the clock rate of the on-chip clock generators.

The clock generator of the present invention has many advantages, including: (1) significant cost savings by cutting down the design time which includes simulation, layout, verification, and library maintenance, (2) compacted layout size, bulky PLL circuits and other components can be eliminated, unwanted resistor and capacitor elements can also be eliminated, and (3) a metal or mask option, fuse/anti-fuse option or a decoding scheme can be used to conduct fine and/or course trimming (to tailor the clock rate) and (4) the clock rate can be programmed after the chip is fabricated or at on a module after the chip or chips have been packaged.

A universal clock generator, in accordance with the invention may use either a metal or mask option, a fuse/anti-fuse option or a decoding scheme to obtain different clock frequencies from one universal clock cell. The metal or mask option includes the capability of masking portions of the layout to prevent connections or applying metal to make connection between elements in the layout. For example, the present invention employs the metal or mask option to connect or disconnect resistor blocks and/or capacitor blocks to achieve a proper clock frequency. The present invention provides loading components including resistors, and capacitors to form modules, so that by adding or deleting such modules, the clock frequency can be adjusted. A frequency table may be included, so that based on this table, an oscillator could be formed with a desirable frequency. The present invention also provides a capability to program the clock rate after the chip is fabricated or packaged.

The present invention provides a universal clock design that generates a clock which does not need to be synchronized with any reference (or system) clock. The universal clocks can be used in areas such as a charge pump, a local clock, or a memory refresh device, etc. Therefore, there is no need for a reference clock, frequency divider, phase detector, or related PLL circuitry. The layout area, and power consumption are much smaller than those of PLLs.

Extra capacitor or resistor components may be used to adjust the frequency of a ring oscillator. In a voltage controlled oscillator, the frequency of the oscillator may be varied by changing the value of voltage supply. However, other than minor adjusting the clock rate, the prior art has not provided a universal clock design concept. In other words, to produce a group of clock rates, different ring oscillator designs and individual physical layouts are needed in the prior art. The clocks that are provided by a PLL cannot easily be closely placed to circuits where the clock is needed.

The present invention includes a circuit layout which can be used in different locations of the chip to provide different clock rates for different applications. This approach will save significantly on the design time, and cell library maintenance cost. The invention also permits flexibility to make modifications of the clock rates. The invention will advantageously make it possible for programming the clock rate when chip is fully fabricated, or packaged in a module, or even installed in a system.

Figure 2:
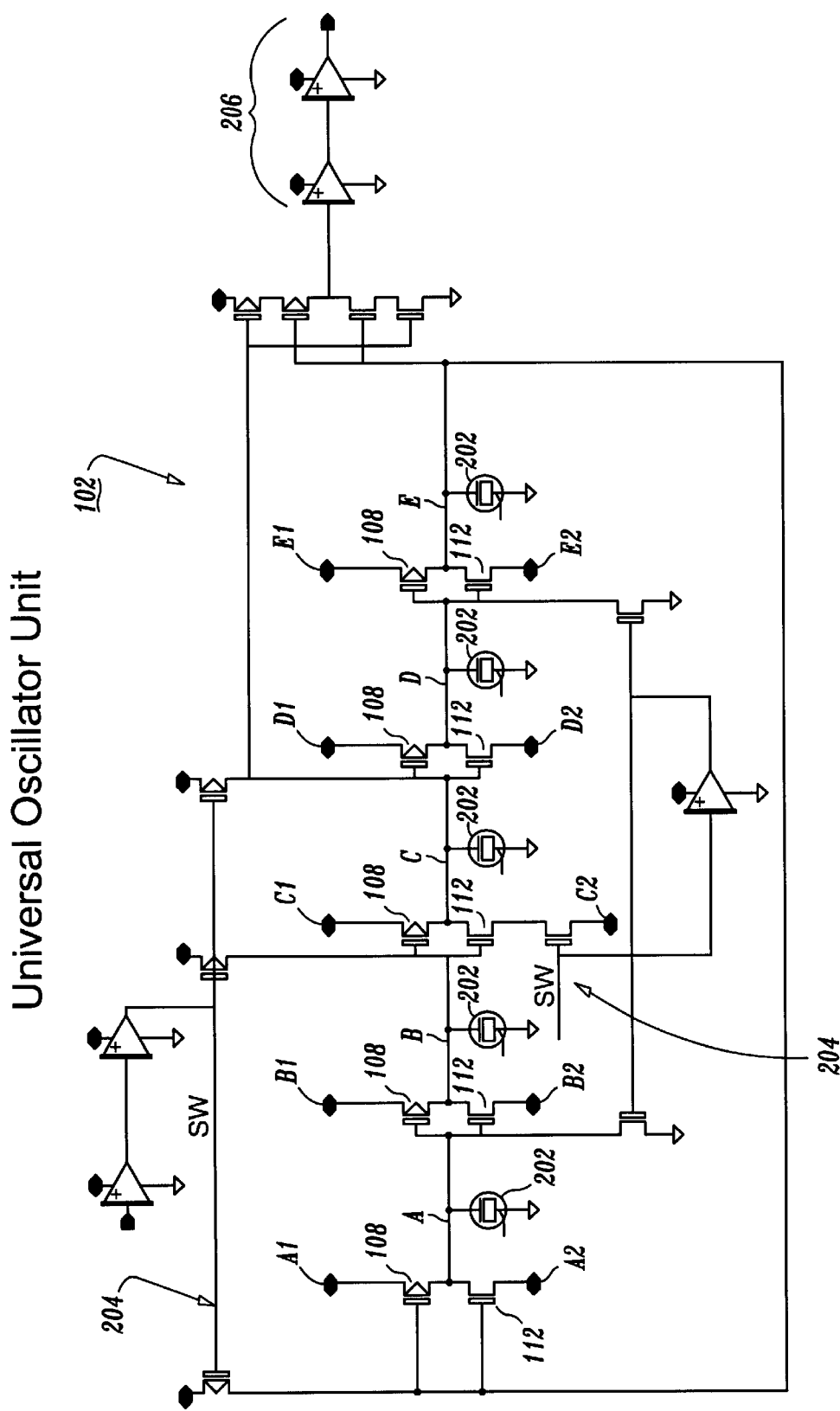
FIG. 2 is an illustrative five stage oscillator unit employed in a universal clock generator in accordance with the present invention.

Referring now to the drawings in which like numerals represent the same or similar elements and initially to FIG. 1, a universal clock generator 100 (hereinafter generator 100) is shown in accordance with one embodiment of the present invention. Generator 100 includes an oscillator block or unit 101, for example, a ring oscillator, plus several resistor blocks 104. Generator 100 shows a single stage of a multiple stage oscillator. A number of resistor blocks 104 when enabled will yield a different clock frequency. Resistor blocks 104 may be enabled or disabled by employing metal options, switches (e.g., transistors), or may be added or deleted from the design altogether. In FIG. 1, an upper group 106 of resistor blocks 104 connect to $V_{ext}$ (e.g., the external power supply) and are linked to pull-up PFET devices 108 of oscillator 102 (FIG. 2). A lower group 110 of resistor blocks 104 connect to the ground and are linked to pull down NFET devices 112 of oscillator 102 (FIG. 2). Resistor blocks 104 may include a plurality of different values. Resistor blocks 104 are shown in FIG. 1 for a single stage of oscillator unit. Multiple connections for a plurality of stage will be described below. In this illustrative example, resistor blocks 105 include coarse adjustment resistor elements having a value of, for example, 7 kΩ. Also, resistor blocks 107 include fine adjustment resistor elements having a value of, for example, 2.5 kΩ. Resistor blocks 104 are enabled and disabled as will be described herein below.

Figure 7:
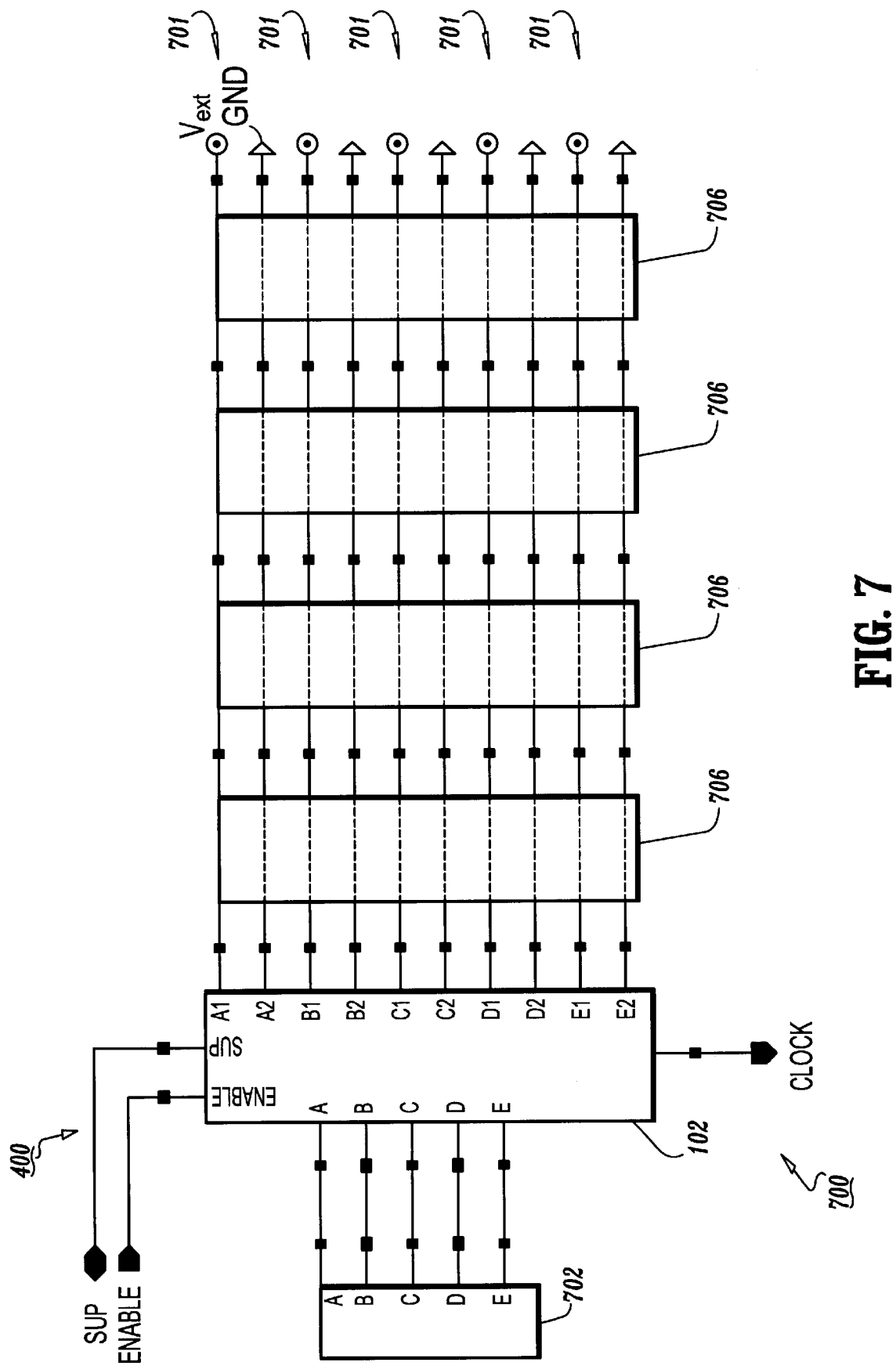
FIG. 7 is a schematic diagram of a universal clock generator having resistor blocks and a capacitor block in accordance with the present invention.

Referring to FIG. 2, an illustrative oscillator unit 102 is shown in greater detail. Oscillator unit 102 includes, for example, a 5-stage ring oscillator including oscillation elements 202. Other amounts of stage may be employed as well, for example, 3 or more stages. A switch 204 includes multiple cycled PFET and NFET devices which are included to turn oscillator unit 102 on and off. An output driver 206 is included to drive a load (clock output). Oscillator unit 102 is a universal oscillator and employs resistive blocks 104 as shown in FIG. 1. Node N1 is one of nodes A1, B1 C1, D1 and E1 which are connected to upper resistor blocks 106, and node N2 is one of A2, B2, C2, D2 and E2 which are connected to lower resistor blocks 110, shown in FIG. 1. FIG. 7 shows all five stages connected in accordance with one embodiment of the invention.

Upper group 106 of resistor blocks 104 are linked to pull-up PFET devices 108 of oscillator 102. Lower group 110 of resistor blocks 104 connect to the ground and are linked to pull down NFET devices 112 of oscillator 102. To maintain symmetry, upper and lower resistor blocks 106 and 110 (see FIG. 1) are preferably designed identically.

Figure 3:
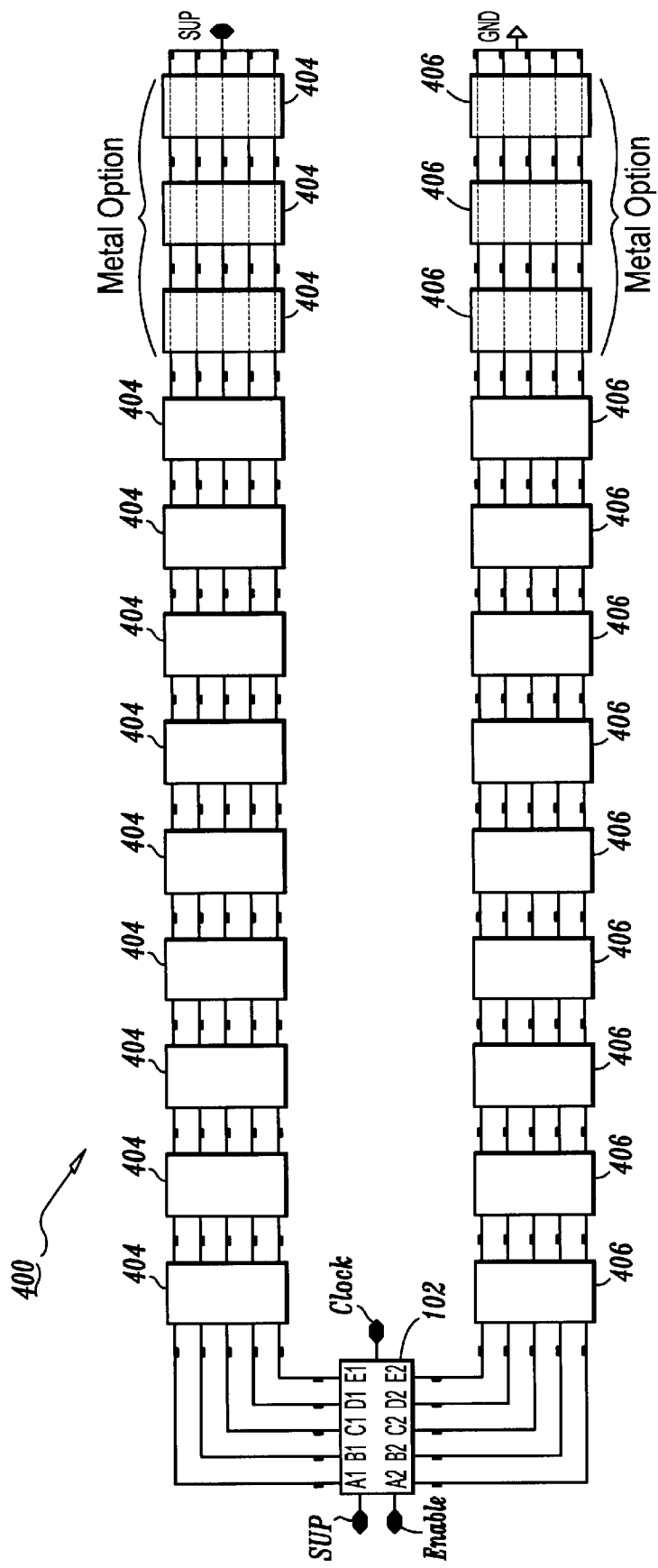
FIG. 3 is a schematic diagram of another universal clock generator having resistor blocks for the oscillator of FIG. 2 in accordance with the present invention.

Referring to FIG. 3, a schematic diagram of a universal clock generator 400 is shown having 12 upper and 12 lower resistive modules 404 and 406, respectively. Resistor modules 404 and 406 may be enabled or disabled by employing metal option shorting. Metal option shorting includes permitting metal connections to be formed during metal deposition to short out components. Fuses or fuse like elements which may blow to cause open circuits to disable one or more connections to resistive modules 404 or 406 may also be employed. Likewise, anti-fuse or anti-fuse like elements may be employed to make connections to enable, for example, resistive modules 404 or 406. Fuse and anti-fuse technology is known in the art. In a preferred embodiment, laser fuses or anti-fuses may be employed. In the illustrative example, metal option shorting or anti-fuse shorting are performed on the last three resistor blocks (upper and lower blocks) labeled "Metal Option/Fuse Option." The last three blocks have been bypassed.

The number of resistor blocks provided and used is preferably based on the degree of accuracy needed for the final clock frequency. If the accuracy is very crucial, then more units are needed for better trimmability. Trimmability refers to the capability of enabling/disabling or modifying elements (by metal option, fuse option, decoding or other means) to arrive at a desired result. For adjusting the strength of a voltage generator, other than changing the clock frequency, there are many ways to trim the clock generator. For instance, if the reference voltage (SUP) can be trimmed, then the number of the resistor blocks needed or provided can be minimized. If more adjustability is given for a given clock design, for example, supply voltages can be adjusted, then fewer resistor blocks need to be supplied. However, more resistor blocks can be supplied to provide more options for clock frequency or to provide more accuracy for a final clock frequency. In one embodiment, a plurality of different resistor blocks are employed including a plurality of different resistor values to provide a plurality of fine tuning levels. In this way, resistive blocks can be enabled/disabled until the desired clock frequency is achieved.

Figure 4A:
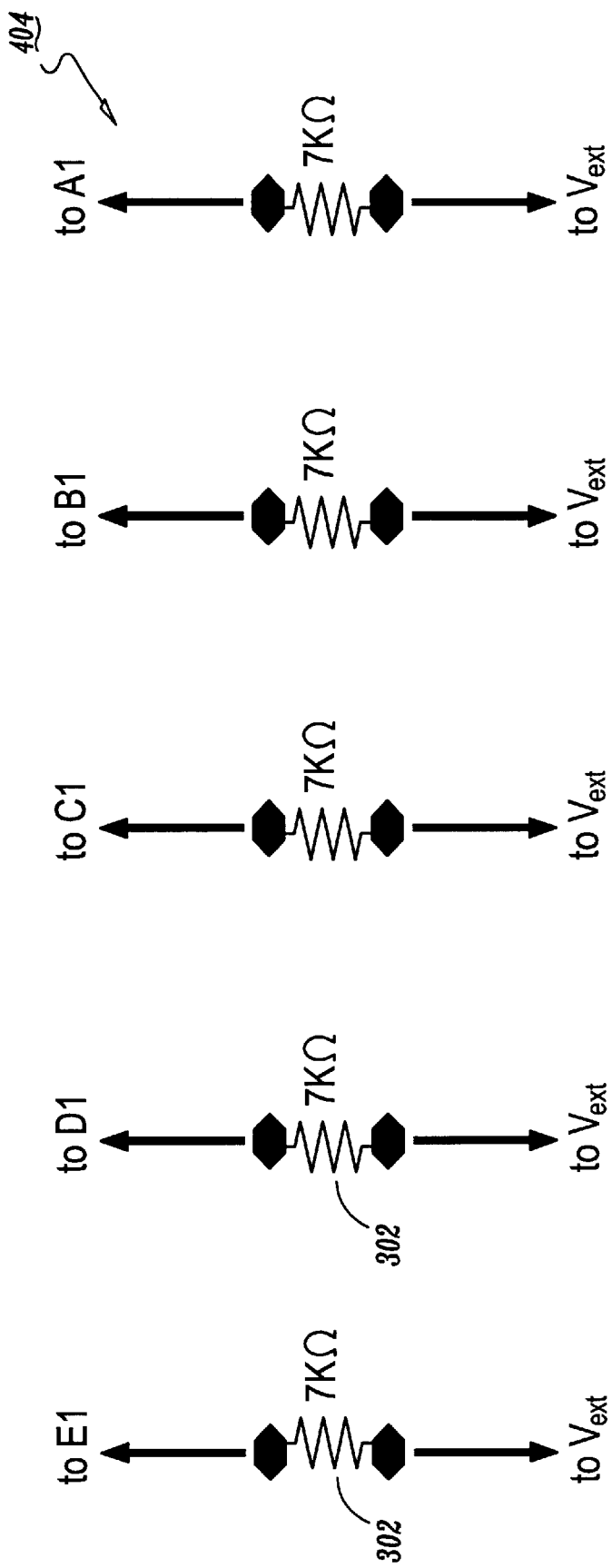
FIGS. 4A–D show resistive elements for the resistor blocks shown in FIG. 3 in accordance with the present invention.
Figure 4B:
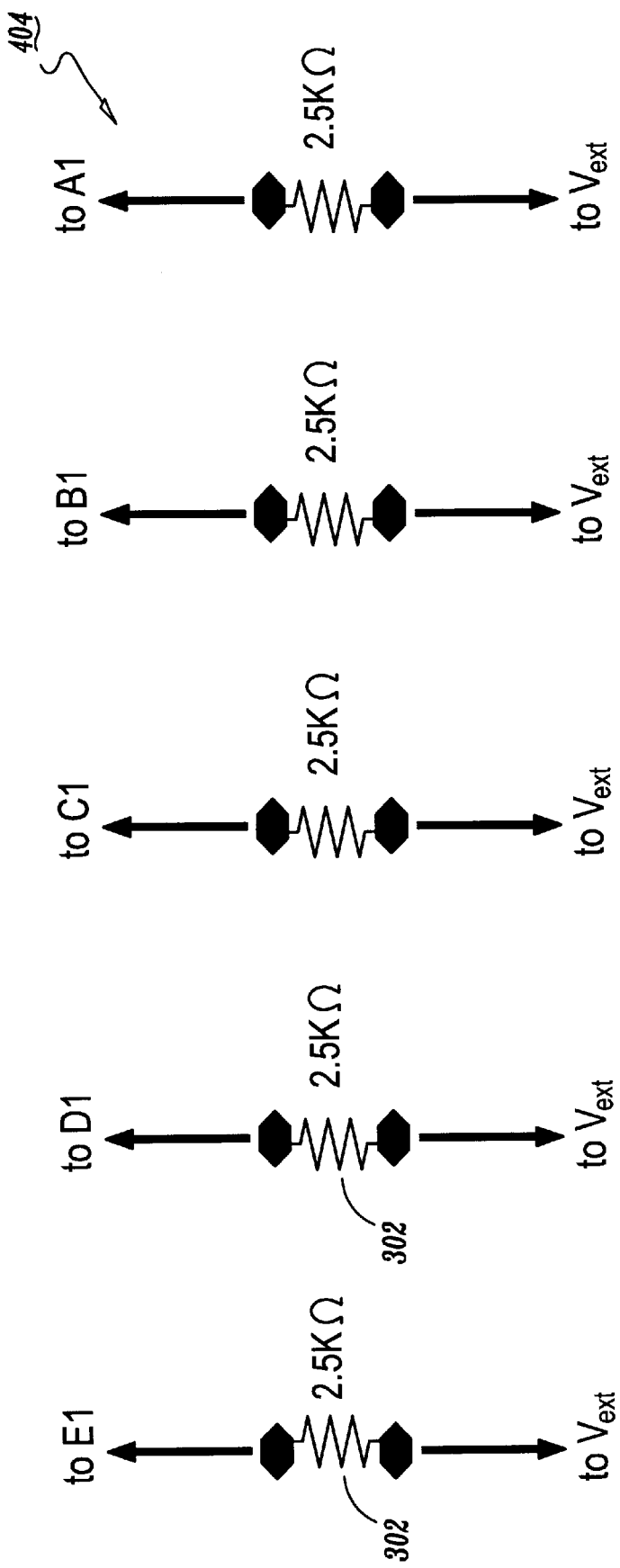
Figure 4C:
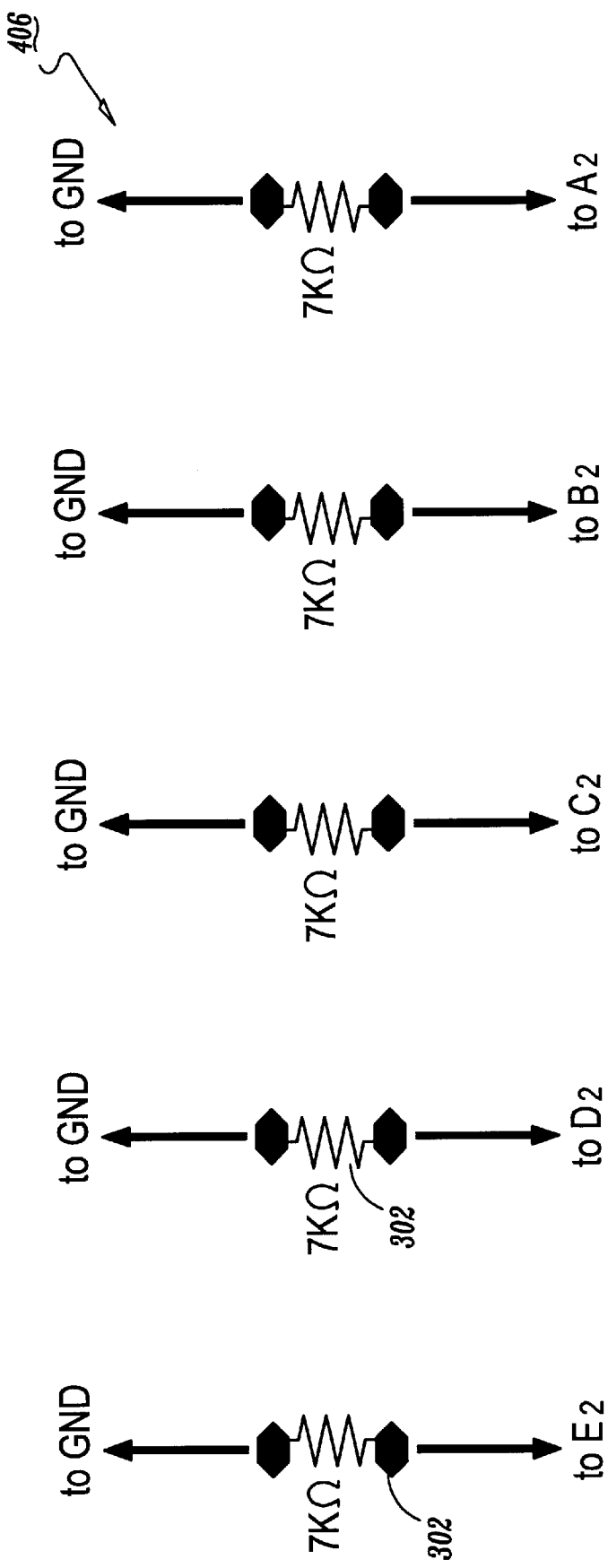
Figure 4D:
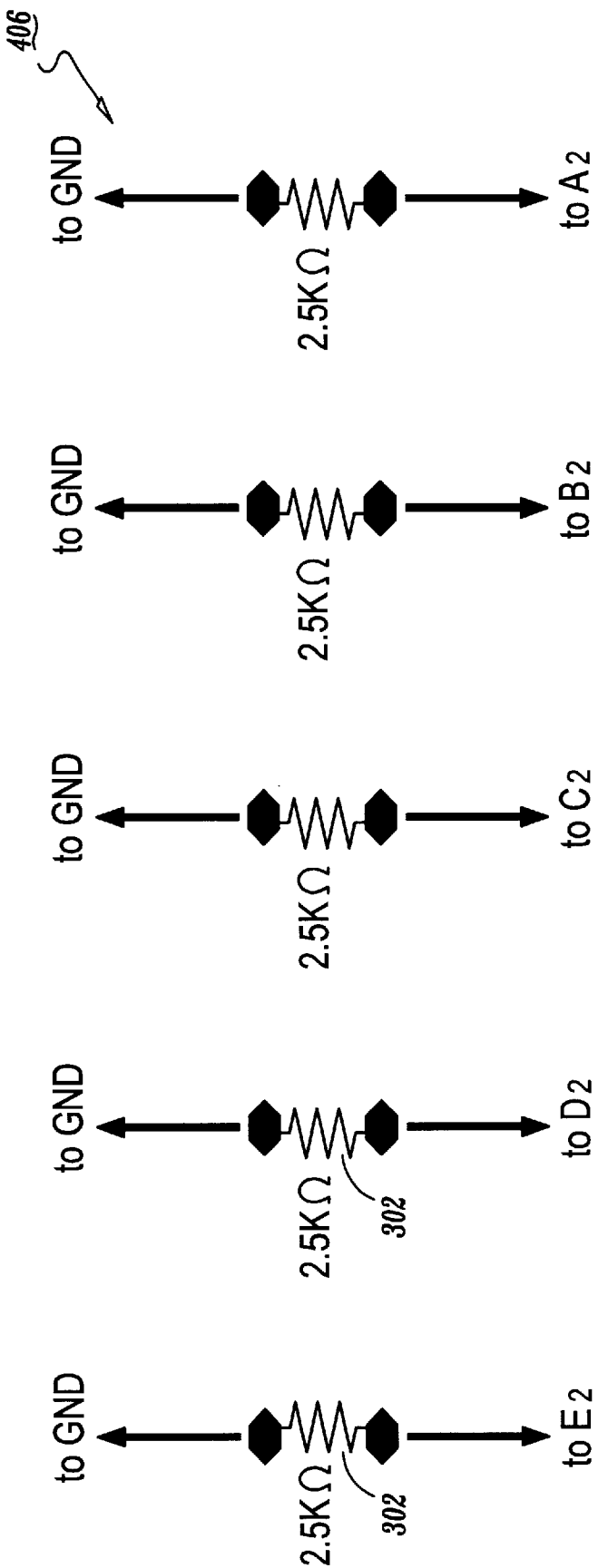

Referring to FIGS. 4A, 4B, 4C and 4D, resistor blocks 404 and 406 may include coarse adjustment resistor elements illustratively having a value of 7 kΩ (FIGS. 4A and 4C) Also, resistor blocks 404 and 406 may include fine adjustment resistor elements illustratively having a value of 2.5 kΩ (FIGS. 4B and 4D). Resistor modules 404 include resistor elements 302 which are connectable to nodes A1, B1, C1, D1 and E1. Each resistor module 404 is arranged in a similar manner to provide connectability to PFETs 108 of oscillator unit 102 (see FIG. 2). Resistor modules 406 include resistor elements 302 which are connectable to nodes A2, B2, C2, D2 and E2. Each resistor module 406 is arranged in a similar manner to provide connectability to NFETs 112 of oscillator unit 102 (see FIG. 2). Resistor elements 302 can be realized as polysilicon resistors, diffusion resistors, diode type resistors, transistors in the linear region, thin film transistors or any other resistive element.

Each block (404 or 406) preferably includes resistors of a same value, although different resistor values may be employed in a same block. Examples of values of resistors may include 7 kΩ, 5 kΩ, 2.5 kΩ, 1 kΩ, 0.5 kΩ, etc.

Figure 5A:
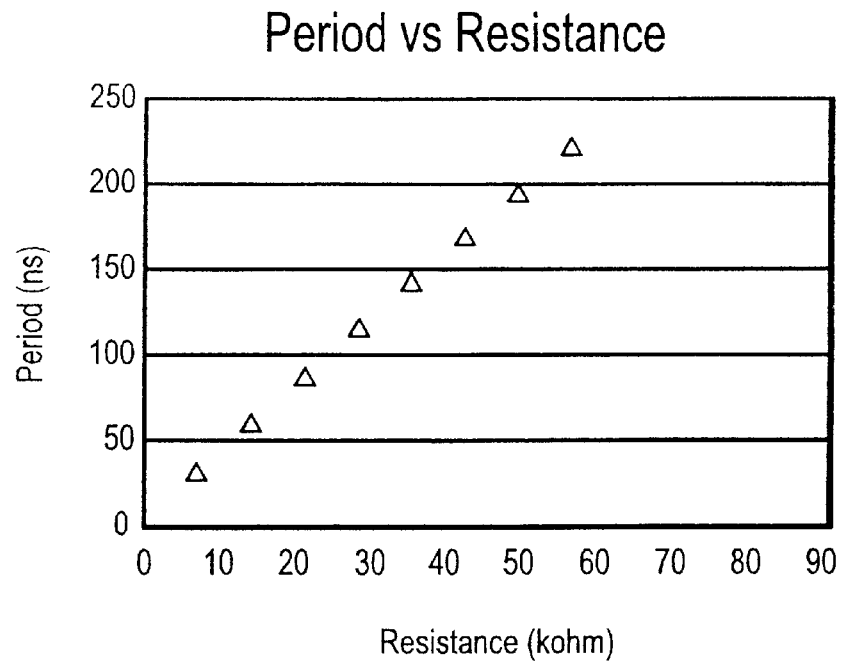
FIG. 5A shows an illustrative plot of period versus resistance used for selecting resistor blocks to provide a clock period in accordance with the present invention.
Figure 5B:
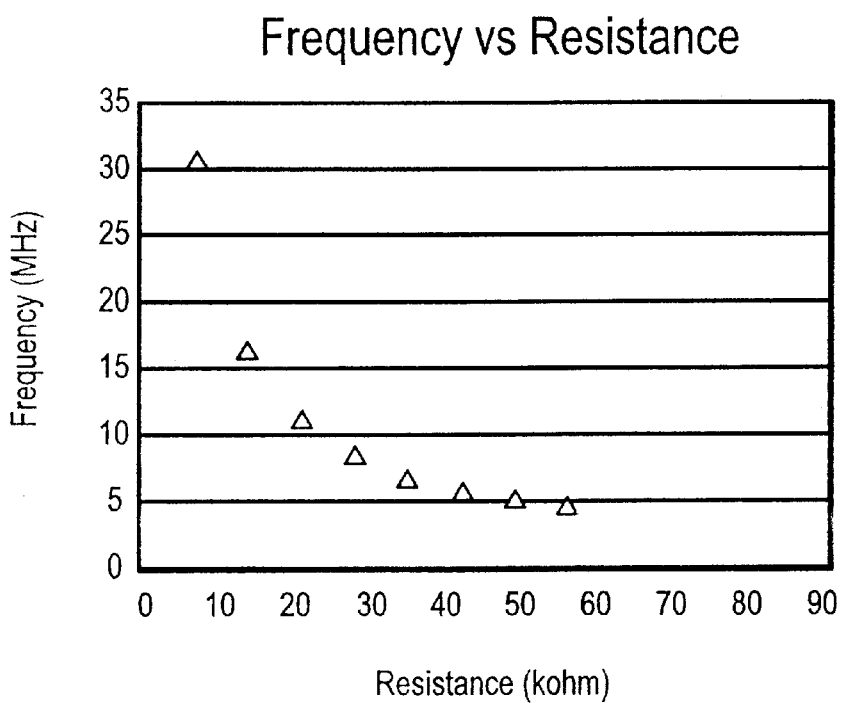
FIG. 5B shows an illustrative plot of frequency versus resistance used for selecting resistor blocks to provide a clock rate in accordance with the present invention.

Referring to FIGS. 5A and 5B, HSPICE simulation results are shown which indicate relationships of resistor value versus clock pulse period (FIG. 5A) and clock frequency (FIG. 5B). From this study, information can be ascertained as to how many or which resistor modules needed to be employed to generate a given clock frequency or a clock pulse period. For example, if an active Vpp pump needs an oscillator to generate 30 MHz of frequency, FIG. 5B is referenced. A 30 MHz frequency corresponds to a resistance of about 12 kΩ. In this example, 7 kΩ modules and 2.5 kΩ are available. Therefore, one large (7 kΩ) and two small resistor (each 2.5 kΩ) elements or blocks are needed to provide 12 kΩ. In another example, a plurality of resistor blocks are available, for example, 7 kΩ, 2.5 kΩ, 1 kΩ, etc. A clock signal of 5 MHz clock is needed for a control data path. According to FIG. 5B, 7 large resistor blocks (7 kΩ) and one small resistor block (1 kΩ) are needed to form a resistive load of 50 kΩ. The relationships shown in FIGS. 5A and 5B are illustrative. Other relationships may be employed.

Figure 6:
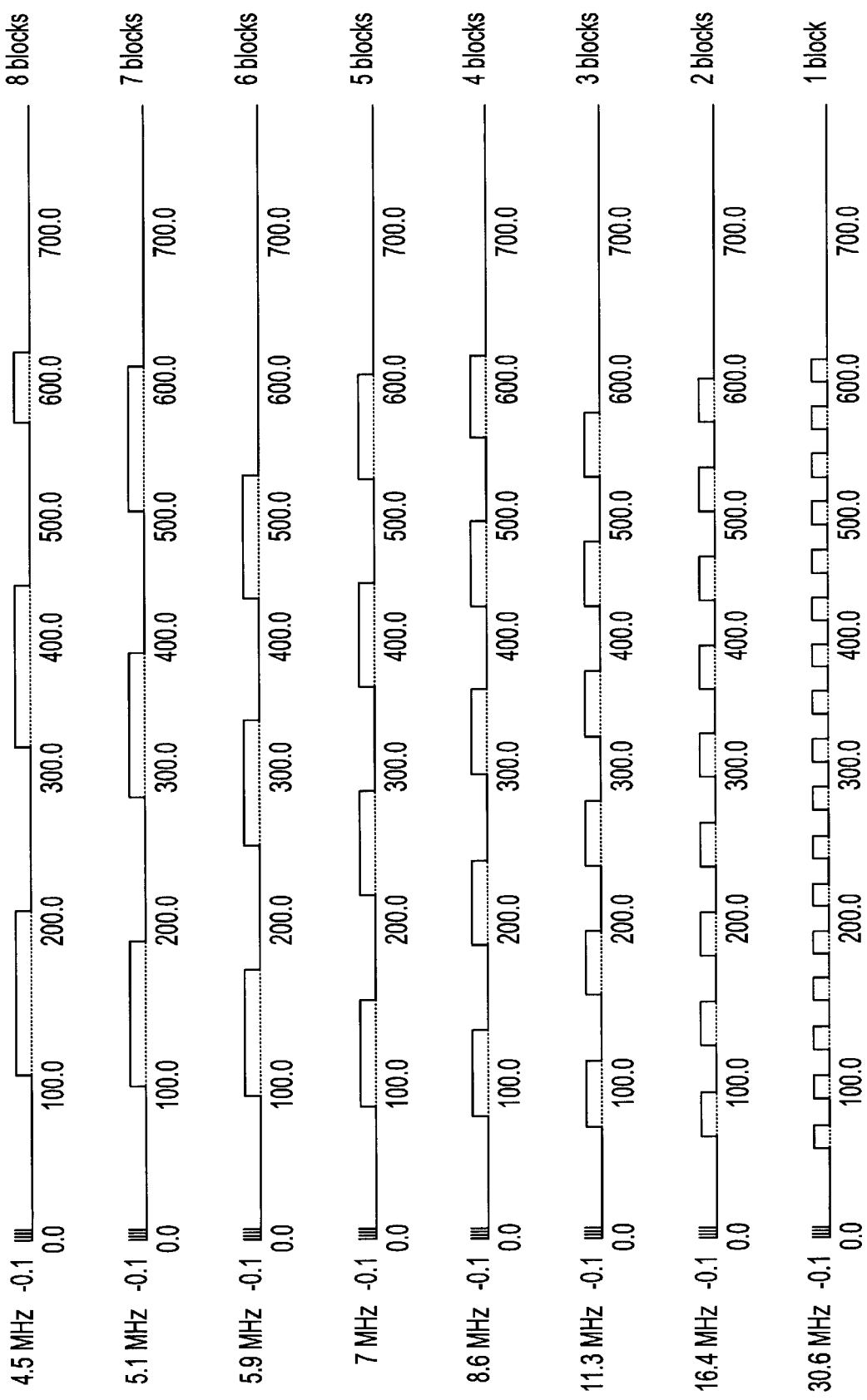
FIG. 6 is a series of plots of clock rates showing the dependence on resistor blocks in accordance with the present invention.

Referring to FIG. 6, to further illustrate the present invention, a plurality of waveforms are shown for different configurations of the present invention. For example, the number of resistive blocks in this embodiment is eight (16 blocks total for upper and lower). On the left side of the FIG. 6 the frequency of the waveforms are shown in sequence as 4.5 MHz, 5.1 MHz, 5.9 MHz, 7 MHz, 8.6 MHz, 11.3 MHz 16.4 MHz and 30.6 MHz with the number of resistor blocks decreasing from 8 to 1 (each block having a resistance of 7 kΩ). The number of resistive blocks employed is shown on the right hand side of FIG. 6.

Referring to FIG. 7, another embodiment of universal clock generator 700 in accordance with the present invention is shown which includes a capacitor unit 702. Nodes A, B, C, D and E of capacitor unit 702 to provide additional capacitance to nodes A, B, C, D and E of oscillator unit 102 (see also FIG. 2). By adjusting capacitor unit 702, for example by enabling or disabling connections to oscillator unit nodes A, B, C, D and E, the frequency of oscillator unit 102 can be tuned. Universal oscillator 102 may be employed to selectively add or subtract capacitance to/from oscillator unit 102 to reach a desirable frequency range. This may be performed by employing a metal/mask option, fuse/anti-fuse option or a decoder to adjust a number of connected capacitor units to oscillator unit 102. Clock generator 700 includes resistor blocks 706 which include resistor elements. These resistive elements are connected in five load components 701. Each load component 701 is connected alternately between $V_{ext}$ and ground (GND). Each load component 701 includes upper and lower resistive elements which are preferably symmetrical about PFETs 108 and NFETs 112 (FIG. 2) of oscillator unit 102. The capacitor elements may include metal oxide semiconductor device gate capacitors, deep trench capacitors, stacked capacitors or any other capacitive element. In one illustrative example, four resistor blocks 706 are employed. A frequency of, for example, 8.65 MHz is desired from a frequency 33 MHz. This may be achieved by adding capacitance from capacitor unit 702, adding more resistance elements from resistor blocks 706 or a combination of both. On the other hand, a highest clock frequency can be achieved using only one resistor element and without attaching any capacitor unit.

Figure 8:
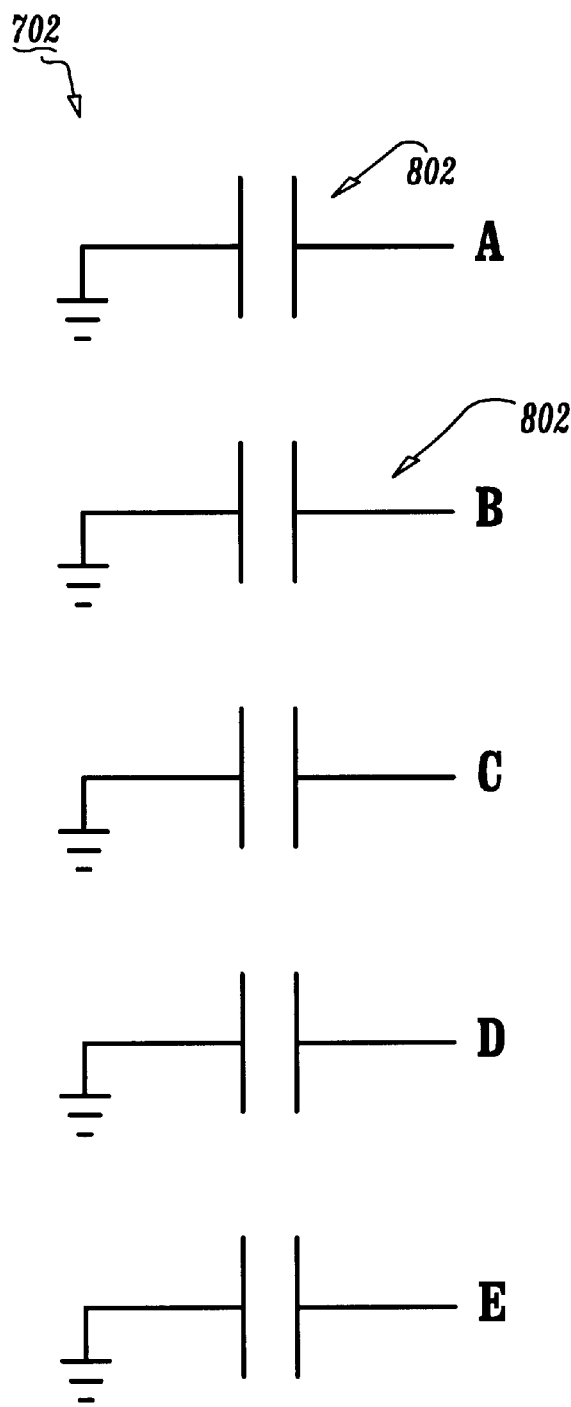
FIG. 8 shows capacitive elements for the capacitor block shown in FIG. 7 in accordance with the present invention.

Advantageously, the layout of clock generator 700 includes alternating $V_{ext}$ and GND connections so as to reduce noise. In this case, each resistor block 706 includes 10 resistor elements for pull-up and pull-down of each oscillator stage (See e.g., FIG. 2). Each capacitor block illustratively includes 5 capacitor elements one for each internal node (e.g., nodes A, B, C, D and E) of oscillator unit 102. FIG. 8 shows a capacitor block or unit 702 having capacitor elements 802 in accordance with the invention. The capacitor elements 802 may include metal oxide semiconductor device gate capacitors, deep trench capacitors, stacked capacitors or any other capacitive element. FIG. 11 shows an illustrative relationship for adding more capacitors to a clock to adjust the clock frequency.

Referring to FIGS. 9A–D, clock generator 700 is illustratively shown having various configurations to achieve different clock frequencies. In FIG. 9A, a 7 MHz clock frequency is achieved by employing all 5 resistor blocks 706 and all capacitor block 702 connections (A through E). This clock frequency may illustratively be employed for a Vpp stand-by pump generator for DRAM chips. In FIG. 9B, a 20 MHz clock frequency is achieved by employing 2 resistor blocks 706 and 4 capacitor block 702 connections (connection B is disabled). This clock frequency may illustratively be employed for a Vbb power for DRAM chips. In FIG. 9C, a 25 MHz clock frequency is achieved by employing 2 resistor blocks 706 and 3 capacitor block 702 connections (connection B and D are disabled). This clock frequency may illustratively be employed for Vbb active generator for DRAM chips. In FIG. 9D, a 30 MHz clock frequency is achieved by employing 1 resistor block 706 and all capacitor block 702 connections (A through E). This clock frequency may illustratively be employed for Vpp active generator for DRAM chips. It is to be understood that both capacitor block and resistor block connections may be selectively enabled/disabled in all embodiments of the present invention. This enable/disable capability may be performed by employing fuses and anti-fuses, by metal/mask option, by employing a decoder with a control word for enabling/disabling selected blocks using switches (e.g., transistors) or by employing other methods.

Figure 10:
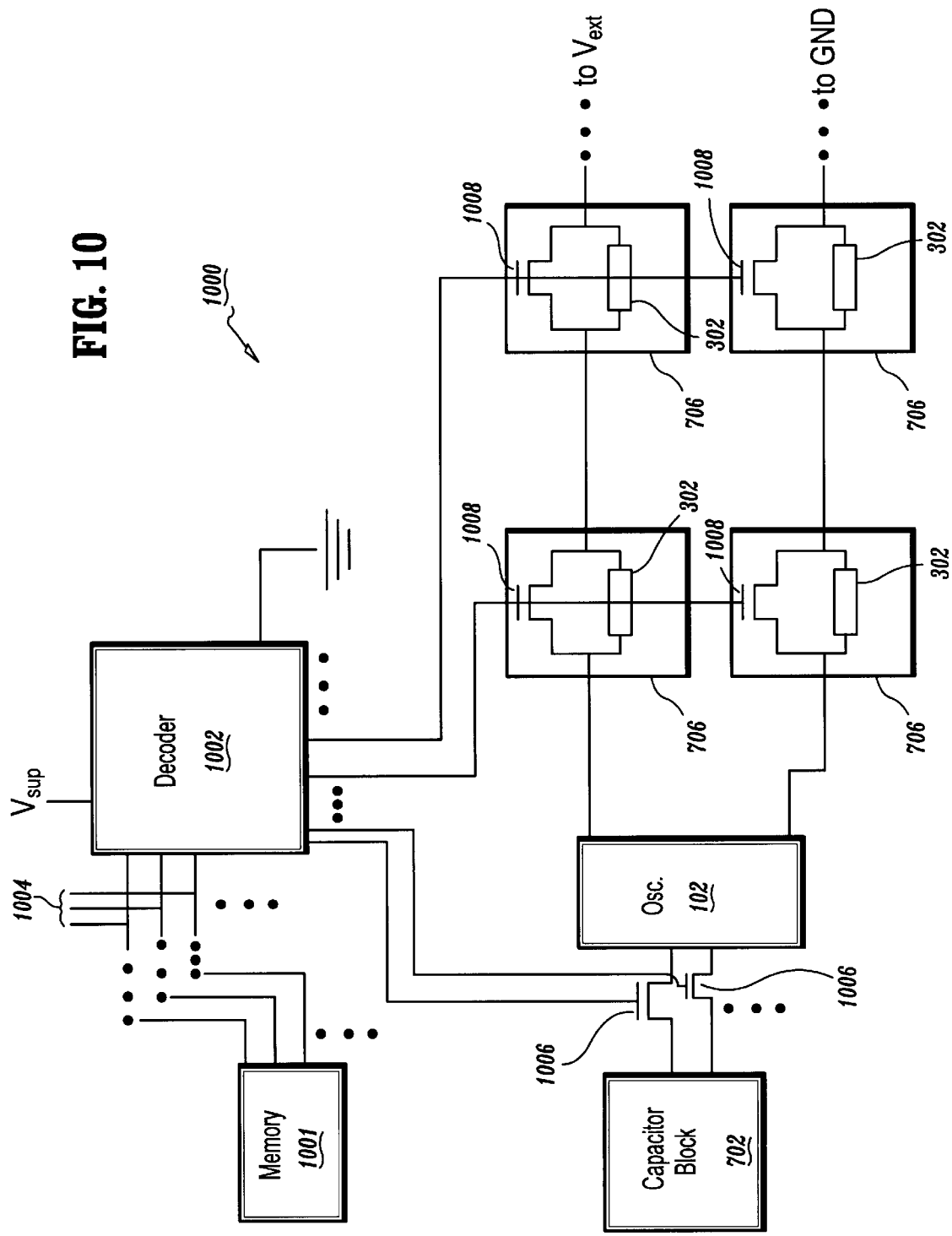
FIG. 10 is a schematic diagram showing an illustrative decoding system for enabling/disabling blocks in accordance with the present invention.

Referring to FIG. 10, an illustrative clock generator system 1000 is shown for employing control words to enable or disable resistor or capacitor blocks or elements is shown. System 1000 includes one or more decoders 1002 for receiving an input word 1004. Input word 1004 may be input from an external source or from a memory device 1001. Memory device 1001 may include read only memory (ROM), programmable ROM, erasable programmable read only memory (EPROM), electrically erasable programmable read only memory (EEPROM), ferro-electrically erasable programmable read only memory (FEPROM), or other memory devices or storage media. Input word 1004 is decoded and enables/disables transistors 1006 and 1008 for capacitor blocks 702 and resistor blocks 706, respectively. Connection paths include transistors 1006 and 1008 which permit conduction therethrough in accordance with input word 1004. Transistors 1008 when activated bypass resistor elements 302. An input word may control different combinations of capacitor block connections and resistor block connections. Decoder logic may be provided depending on the clock frequency needed.

By enabling/disabling capacitor block connections and resistor block connections using a digital word, clock frequencies may be provided after a chip has been fabricated or packaged. In addition, the clock frequency can be adjusted at anytime depending on the input word 1004. It is contemplated that the addressing scheme and the size of the input word may be changed in accordance with the application(s).

Referring to FIG. 11, a table is illustratively shown indicating clock frequencies provided for different RC configurations. FIG. 11 is based on the configuration shown in FIG. 7 with additional resistor blocks (up to seven). The resistor blocks shown include 7 kΩ resistor elements and the capacitor units may be in the range of between about $10^{-6}$ to about $10^{-15}$ Farads. The table of FIG. 11 can be generated and employed by a system designer or employed by the system to automatically select or update a clock rate. The table may be employed to generate an input word (1004 of FIG. 10) to select resistor and/or capacitor blocks to be enabled or disabled.

Metal options or fuse/anti-fuse options used here can short the unwanted resistor blocks and connect only the needed capacitor devices. It makes the overall design and circuit layout very easy and less time consuming to design. A decoding scheme may also be employed to choose the proper connection combinations for proper clock rate. For example, with a three-bit address, eight clock rate options can be provided. Based on a table, a designer can easily connect the addressed lines to Vdd (SUP) or ground to get the desired clock frequency.

Depending on the need, one can add more resistor blocks to a layout. In the last resistor block, each of the resistors is tied to either a supply line or ground. For any unwanted capacitor, after disconnecting it from the oscillator, both terminals are preferably tied to ground.

The present invention provides a universal clock generator. Designers can use either a metal/mask option, fuse/anti-fuse option, a decoding scheme or a programmable device to obtain different clock frequencies from one cell. This clock generator of the present invention includes at least the following advantages: (1) the clock generator significantly saves cost by cutting down the design time which includes simulation, layout, verification, and library maintenance (2) the clock generator has compact layout size, and (3)the clock generator may have resistive or capacitive blocks enabled or disabled by employing metal/mask options, fuse/anti-fuse options or a decoding/programmable scheme. Advantageously, a component library need only include a single clock layout, e.g., a universal clock layout and capacitor and resistor blocks in accordance with the present invention. In this way an oscillator unit is provided having a maximum clock frequency capability which can be scaled down to appropriate clock frequencies in other portions of a single chip. The universal clock can be altered to provide a given clock frequency by 1) leaving out components from the layout (e.g., resistor blocks and/or capacitor blocks) or 2) selecting resistor blocks and/or capacitor blocks to be enabled or disabled by metal option or decoder and switches (e.g., transistors).

A specific or present clock rate can be selected by decoding the clock generator circuit through programming when the chip is in the testing or packaging mode. The layout of universal clock is preferably in a modular form which can be added and deleted during layout to select certain clock rate. The layout of capacitor block may also be in a modular form which can be physically or electrically added and deleted during layout, during testing or after packaging to select or modify a clock rate.

Figure 12:
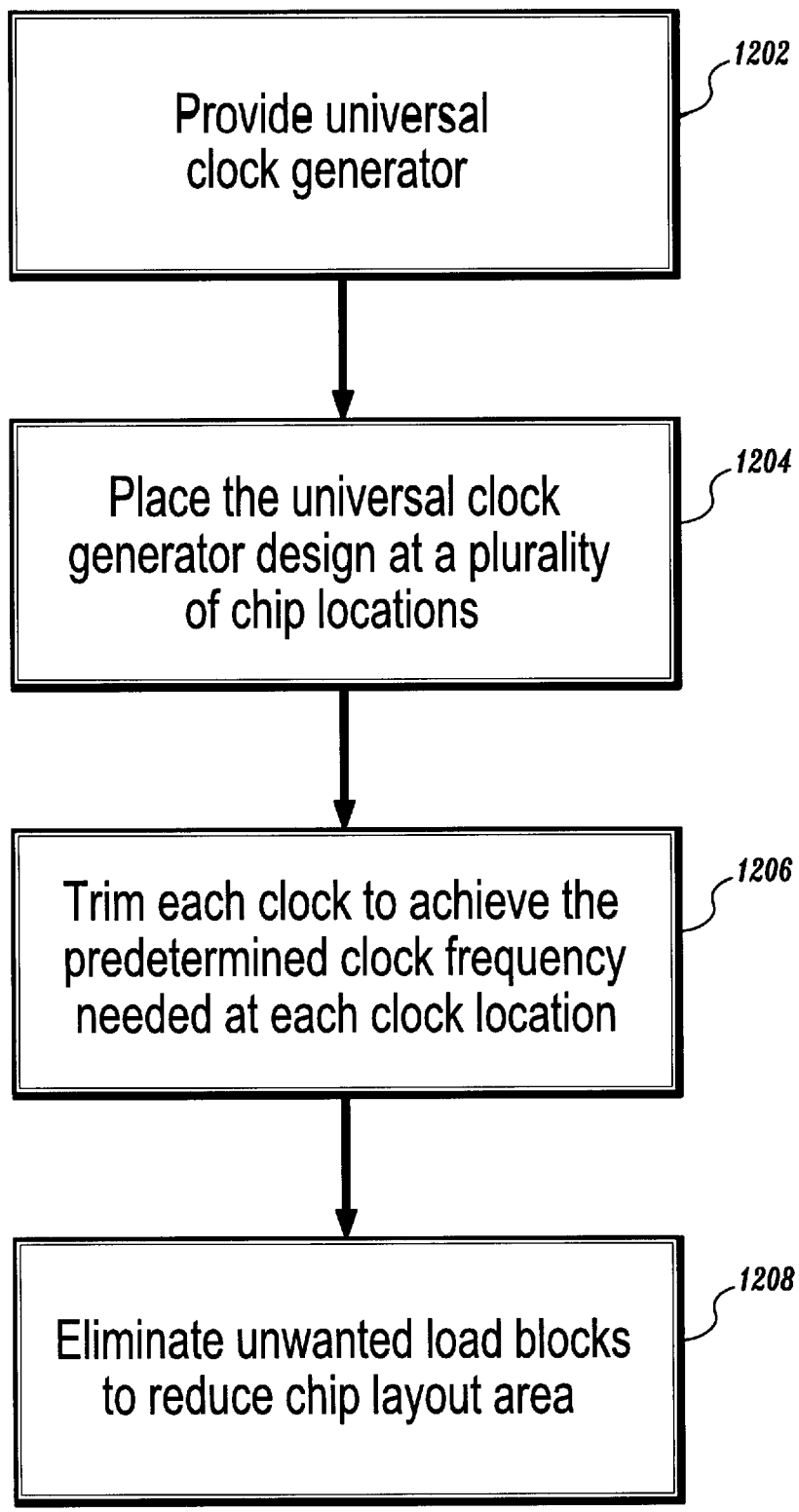
FIG. 12 is a block/flow diagram showing a method for providing universal clock generators to a chip in accordance with the present invention.

Referring to FIG. 12, a method for providing clock signals on a chip in accordance with the present invention is illustratively shown. In block 1202, a universal clock generator circuit design is provided as described above. The design may include a layout in a design library including an oscillator unit and a plurality of load blocks. The design of the clock generator is placed at a plurality of locations on a semiconductor chip in block 1204. This is the same design although different designs may be employed on a single chip as well. In block 1206, the load blocks are trimmed to provide a clock frequency from each universal clock generator circuit on the semiconductor chip. This trimming includes the actual setting of the clock frequency not just fine tuning the clock. For example, if the same clock generator circuit is placed at three locations on a chip, a first location may include an 8 MHz clock, a second location may include an 18 MHz clock and a third location may include a 30 MHz clock. All three clock generators have the same design with different trimming. The trimming of the load blocks may include providing connections and disconnections between the load blocks while forming the load blocks, for example, during metal deposition connections are formed; while disconnections are formed by masking would be connection areas. Trimming the load blocks may also include connections and disconnections between the load blocks by respectively employing anti-fuses and fuses between the load blocks or employing transistors between the load blocks to enable and disable the connections. The trimming of the load blocks may further include programming transistors between the load blocks to enable and disable connections. This may be achieved by programming the transistors by employing a memory storage device or external control source. The transistors may be programmed after the semiconductor chip has been fabricated or packaged.

In block 1208, trimming the load blocks may also include eliminating load blocks from a layout to reduce layout area on the chip. Load blocks may include resistor blocks or capacitor blocks. In preferred embodiments, resistor blocks have values between about 10Ω and about 100 MΩ, and capacitor elements have values between 10 fF to about 100 nF.

Having described preferred embodiments for a universal clock generator (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A universal clock generator circuit comprising:
an oscillator unit including circuitry for providing a first clock frequency; and
a plurality of load blocks, each corresponding to a different frequency adjustment to the first clock frequency when connected to the oscillator unit to provide one of at least three clock frequencies from a same output;
the load blocks including resistor blocks, the resistor blocks including first blocks and second blocks, the first blocks being connected in series and having a first end connected to a voltage source and a second end connected to the oscillator unit, the second blocks being connected in series and having a first end connected to a ground and a second end connected to the oscillator unit.

2. The circuit as recited in claim 1, wherein the oscillator unit includes a ring oscillator.

3. The circuit as recited in claim 1, wherein the load blocks include a plurality of groups of resistor blocks, the groups of resistor blocks providing a plurality of levels of adjustment of the one of a plurality of clock frequencies.

4. The circuit as recited in claim 1, wherein the first blocks and the second blocks are symmetrical relative to each other.

5. The circuit as recited in claim 1, wherein the selectable connections of the load blocks include fuse structures for enabling and disabling the load blocks to selectively connect the load blocks to the oscillator unit.

6. The circuit as recited in claim 1, wherein the selectable connections of the load blocks include transistors for enabling and disabling the load blocks to selectively connect the load blocks to the oscillator unit.

7. The circuit as recited in claim 1, further comprising a capacitor block having at least one capacitor element which connects to the oscillator unit to further adjust the one of a plurality of clock frequencies.

8. The circuit as recited in claim 1, further comprising a plurality of groups of capacitance elements, the groups of capacitance elements providing a plurality of levels of adjustment of the one of the plurality of clock frequencies.

9. The circuit as recited in claim 1, wherein the selectable connections include programmable connections.

10. A universal clock generator circuit comprising:
an oscillator unit including circuitry for providing a first clock frequency;
a plurality of resistor blocks including resistive elements, the resistor blocks being arranged in series and having selectable connections to the oscillator;
a capacitor block having at least one capacitor element having selectable connections to the oscillator unit;
the plurality of resistor blocks and the capacitor block including the selectable connections which are enabled and disabled to adjust the first clock frequency by selective connection of a number of the resistor blocks and capacitor elements to the oscillator unit to provide one of at least three clock frequencies from a same output.

11. The circuit as recited in claim 10, wherein the oscillator unit includes a ring oscillator.

12. The circuit as recited in claim 10, wherein the resistor blocks include a plurality of groups of resistor blocks, the groups of resistor blocks providing a plurality of levels of adjustment of the one of a plurality of clock frequencies.

13. The circuit as recited in claim 10, wherein the resistor blocks include first blocks and second blocks, the first blocks being connected in series and having a first end connected to a voltage source and a second end connected to the oscillator unit, the second blocks being connected in series and having a first end connected to a ground and a second end connected to the oscillator unit.

14. The circuit as recited in claim 13, wherein the first blocks and the second blocks are symmetrical relative to each other.

15. The circuit as recited in claim 10, wherein the selectable connections of the resistor blocks and the capacitive elements include fuse structures for enabling and disabling the resistor blocks and the capacitive elements to selectively connect the resistor blocks and the capacitive elements to the oscillator unit.

16. The circuit as recited in claim 10, wherein the selectable connections of the resistor blocks and the capacitive elements include transistors for enabling and disabling the resistor blocks and the capacitive elements to selectively connect the resistor blocks and the capacitive elements to the oscillator unit.

17. The circuit as recited in claim 10, wherein the selectable connections include programmable connections.

18. The circuit as recited in claim 10, wherein the capacitance elements include a plurality of groups of capacitance elements, the groups of capacitance elements providing a plurality of levels of adjustment of the one of a plurality of clock frequencies.

19. A universal clock generator circuit layout comprising:
an oscillator circuit for providing a first clock frequency;
a plurality of resistor blocks including resistive elements, the resistor blocks including a first group of resistor blocks and a second group of resistor blocks, the first group of resistor blocks being connected in series and having a first end connected to a source and a second end connected to the oscillator circuit, the second group of resistor blocks being connected in series and having a first end connected to a ground and a second end connected to the oscillator circuit;
a capacitor block having at least one capacitor element connected to the oscillator circuit;
the plurality of resistor blocks and the capacitor block including selectable connections which are enabled and disabled to adjust the first clock frequency by selectively connecting a number of the resistor blocks and capacitor elements to the oscillator unit to provide one of at least three clock frequencies from a same output.

20. The layout as recited in claim 19, wherein the resistor blocks include a plurality of different resistance values for levels of adjustment of the one of a plurality of clock frequencies.

21. The layout as recited in claim 19, wherein the first blocks and the second blocks are symmetrical relative to each other.

22. The layout as recited in claim 19, wherein the selectable connections include fuse structures for enabling and disabling the resistor blocks and the capacitive elements to selectively connect the resistor blocks and the capacitive elements to the oscillator circuit.

23. The layout as recited in claim 19, wherein the selectable connections include transistors for enabling and disabling the resistor blocks and the capacitive elements to selectively connect the resistor blocks and the capacitive elements to the oscillator circuit.

24. The layout as recited in claim 19, wherein the selectable connections include programmable connections.

25. The layout as recited in claim 19, wherein the layout is employed at a plurality of locations on a chip, wherein at least two different clock frequencies are provided by the layouts at the different positions.

26. The layout as recited in claim 19, wherein the layout is the only type of clock circuit employed on a chip to provide different clock frequencies at a plurality of locations on the chip.

27. A method for providing clock signals on a chip comprising the steps of:

provviding a universal clock generator circuit comprising an oscillator unit including circuitry for providing a first clock frequency, and a plurality of load blocks connected in series between a supply node and the oscillator unit and between a ground node and the oscillator unit, the load blocks including selectable connections for connecting to the oscillator such that a range of clock rates are derived from the first clock frequency by selectively connecting a number of the load blocks to the oscillator unit to provide one of at least three clock frequencies from a same output;

placing the universal clock generator circuit at a plurality of locations on a semiconductor chip; and trimming the load blocks to provide a clock frequency from each universal clock generator circuit on the semiconductor chip.

28. The method as recited in claim 27, wherein the step of trimming the load blocks includes the step of providing connections and disconnections between the load blocks while forming the load blocks.

29. The method as recited in claim 27, wherein the step of trimming the load blocks includes the step of providing connections and disconnections between the load blocks by respectively employing anti-fuses and fuses between the load blocks.

30. The method as recited in claim 27, wherein the step of trimming the load blocks includes the step of providing connections and disconnections between the load blocks by employing transistors between the load blocks to enable and disable connections.

31. The method as recited in claim 27, wherein the step of trimming the load blocks includes the step of eliminating load blocks from a layout to reduce layout area.

32. The method as recited in claim 27, wherein the step of trimming the load blocks includes the step of providing connections and disconnections between the load blocks by programming transistors between the load blocks to enable and disable connections.

33. The method as recited in claim 32, wherein the step of programming transistors includes programming the transistors by employing a memory storage device.

34. The method as recited in claim 32, wherein the transistors are programmed after the semiconductor chip has been fabricated.

35. The method as recited in claim 32, wherein the transistors are programmed after the semiconductor chip has been packaged.

* * * * *